United States Patent [19]
Fujihira et al.

[11] Patent Number: 5,621,601
[45] Date of Patent: Apr. 15, 1997

[54] OVER-CURRENT PROTECTION APPARATUS FOR TRANSISTOR

[75] Inventors: Tatsuhiko Fujihira; Shin Kiuchi; Kazuhiko Yoshida; Yukio Yano; Kazunori Oyabe; Shoichi Furuhata; Tetsuhiro Morimoto, all of Nagano, Japan

[73] Assignee: Fuji Electric Co., Ltd., Tokyo, Japan

[21] Appl. No.: 314,320

[22] Filed: Sep. 28, 1994

[30] Foreign Application Priority Data

Jan. 10, 1993 [JP] Japan ................................. 5-245840
Mar. 14, 1994 [JP] Japan ................................. 6-041654

[51] Int. Cl.⁶ ............................................... H02H 3/00
[52] U.S. Cl. .............................. 361/93; 361/18; 361/115
[58] Field of Search ............................. 361/93, 18, 56, 361/115

[56] References Cited

U.S. PATENT DOCUMENTS

| | | | |
|---|---|---|---|
| 4,783,690 | 11/1988 | Walden et al. | 357/23.4 |
| 4,893,158 | 1/1990 | Mihara et al. | 357/23.13 |
| 4,924,344 | 5/1990 | Guajardo | 361/101 |
| 5,023,692 | 6/1991 | Wodarczyk | 357/43 |
| 5,091,664 | 2/1992 | Furuhata | 307/570 |
| 5,097,302 | 3/1992 | Fujihira et al. | 357/23.4 |
| 5,184,272 | 2/1993 | Suda et al. | 361/87 |

FOREIGN PATENT DOCUMENTS

| | | | |
|---|---|---|---|
| 0425035 | 2/1991 | European Pat. Off. | H03K 17/08 |
| 0615342 | 9/1994 | European Pat. Off. | H03K 17/082 |

OTHER PUBLICATIONS

"How Current Sense Technology Improves Power MOSFET Switching Applications" Electron Mini/Micro Northeast Conf. Record (1986) E.10.4.1–E.10.4.4 by Donald L. Zaremba, Jr.

*Primary Examiner*—Jeffrey A. Gaffin
*Assistant Examiner*—Stephen Jackson
*Attorney, Agent, or Firm*—Brumbaugh, Graves, Donohue & Raymond

[57] ABSTRACT

The disclosed invention is designed to prevent the oscillation which often occurs in an over-current protection apparatus for an insulated gate controlled transistor. The apparatus improves the response in current detection, to prevent oscillation, and improves protection speed against overcurrent. This is accomplished by separating the gates of the main transistor and the current detector transistor; by setting a shorter time constant for the gate circuit of the current detector transistor than that of the gate circuit of the main transistor; by feeding the detection signal obtained from the current detecting means which detects the current i of the current detector transistor proportional to the current I flowing through the main transistor, to the control means; and by controlling the gate potentials of both transistors to protect the main transistor from the over-current by feeding the comparison output Sd from the comparator circuit, which compares the voltage of the signal Vd with the reference voltage Vr, to the control circuit.

9 Claims, 4 Drawing Sheets

OVER-CURRENT PROTECTION APPARATUS FOR TRANSISTOR

BACKGROUND OF THE INVENTION

This invention relates to an over-current protection apparatus for an insulated gate controlled transistor such as a power MOS transistor, an insulated gate bipolar transistor, etc. Because the power MOS transistor is applicable in a high frequency range and the insulated gate bipolar transistor is well suited for large current applications due to its output impedance, these insulated gate controlled transistors, with their exceedingly high input impedance, are widely used in a vertical element of a switching power supply, an inverter for controlling a motor, etc.

However, the power transistor requires some protection measures against an over-current since the power transistor is damaged or broken down rather easily by the over-current caused by abnormality on the load side. Currently, protection measures have been incorporated into an integrated circuit together with related circuits. A protection scheme has been known which incorporates a current detector transistor as an over-current protection means for a main transistor. The current detector transistor protects the main transistor by detecting an over-current flowing through the main transistor based on the principles of the Miller current circuit. This protection scheme is described, for example, in Electro mini/micro Northeast Conf. Rec. E 10.4.1–10.4.4., 1986 by D. L. Zaremba Jr. and in the U.S. Pat. No. 4,783,690. FIG. 6 schematically shows the protection technique according to the prior art.

In FIG. 6, a load power supply 2 usually supplies voltage of several hundred volts to a load 1. A main transistor 10 which controls a current flowing through the load 1 is a power MOS transistor, the drain terminal D of which is connected with the load 1 and the source terminal S of which is grounded. The main transistor 10 is usually comprised of many unit structures connected in parallel with each other and repeatedly incorporated into a semiconductor apparatus. A current detector transistor 20 is comprised of from one to several unit structures, assigned to the current detection purpose, having the same unit structure with that of the main transistor 10 and being incorporated into the semiconductor apparatus. As FIG. 6 shows, the drain and the gate of the current detector transistor 20 are connected in common to the drain and the gate of the main transistor 10, respectively. The common gate receives a drive command Ss from a drive circuit 3. Usually, a gate resistance Rg is connected as shown in FIG. 6 to the common gate for adjusting the switching speed of transistor 10 controlling the current supplied to the load 1.

According to the principles of the Miller current circuit, a small follower current i of one several thousandth of a reference current I of the main transistor 10 flows through the current detector transistor 20. The follower current i is detected as a voltage drop across a current detecting means Rd connected to the source of the current detector transistor 20. An operational amplifier 30 compares a detection signal Vd indicative of the voltage drop with reference voltage Vr and outputs a comparison signal Sd indicative of a result of the comparison to a gate control circuit 40. The control circuit 40 outputs a control signal Sc to the common gate of the transistors 10 and 20 based on the comparison signal Sd.

When an over-current flows through the main transistor 10, the detection signal Vd exceeds the reference voltage Vr and the control circuit 40 which receives the comparison signal Sd from the operational amplifier 30 outputs the control signal Sc to the main transistor 10 to limit or shut off the current I flowing through the main transistor 10. When the drive circuit 3 designates ON and OFF of the main transistor 10 by HIGH and LOW of the drive command Ss, the control signal Sc lowers the HIGH signal or changes the HIGH signal to the LOW signal.

The over-current protection apparatus according to the prior art protects the main transistor from an over-current by correctly detecting the current I of the main transistor 10 by means of the current i of the detector transistor 20 based on the principle of the Miller current circuit. However, oscillation tends to occur in the prior art circuit when the main transistor is of large current capacity, the electrostatic capacitance of which is large. This is because, though the feedback control system including the operational amplifier 30 and the control circuit 40 shows quick response and high gain, the controlled system including the gate capacitance and the gate resistance Rg of the main and current detector transistors 10 and 20 cannot quickly follow the control signals Sc.

The simplest measure for preventing the oscillation is to lower the responsiveness and the gain of the feedback system. However, this preventive measure causes insufficient over-current detection sensitivity and an excessively slow protective operation both of which cause damage or breakdown of the main transistor 10. The other measure for solving this problem has been to provide the operational amplifier 30 with a phase compensation function (see for example "Circuit Techniques For Fully Utilizing Operational Amplifiers" by Iwao Sagara, pp. 14–15, published in 1987 from Nikkan Kougyou). This phase compensation technique will be briefly explained below with reference to FIG. 7.

The operational amplifier 30 illustrated in FIG. 7 is comprised of a differential input block 31 which receives the detected voltage Vd and the reference voltage Vr, an amplifying block 32 which receives output of the differential input block 31, and an output block 33 which is driven by the amplifying block 32 and outputs the comparison signal Sd. A phase compensation capacitor Cp is connected, for example, on the input side of a transistor of the amplifying block 32 as shown in the figure. The phase compensation capacitor Cp shifts the phase of change of the comparison signal Sd corresponding to a change of the detected voltage Vd. The oscillation is prevented, without the deteriorating protective function, by appropriately adjusting the phase delay to match the response delay caused by the gate capacitance of the main transistor 10 of the controlled system.

In applying this compensation method to a practical circuit, it is difficult to adjust the capacitance of the phase compensation capacitor Cp to the characteristics of the controlled system, especially when adjustment of the gate resistance Rg is required depending on the load 1. Further, the capacitance of the phase compensation capacitor Cp becomes large in relation to the increase of the main transistor's current capacity. The compensation capacitance increase requires so wide a chip area for incorporating the capacitor Cp into the integrated circuit that the practical applicability of the phase compensation method is lost and the over-current protection function is lowered due to deterioration of the response of the operational amplifier 30.

In view of the foregoing, it is desirable to have an over-current protection apparatus for a transistor which is free from oscillation, well suited for practical use, and simply configured.

SUMMARY OF THE INVENTION

The object of the present invention is achieved by an over-current protection apparatus for a transistor which is comprised of a current detector transistor, connected in parallel fashion with the main transistor, having an almost similar structure with the main transistor and a gate thereof being separated from a gate of the main transistor; a current detecting means for detecting a value of a current flowing through the current detector transistor and for outputting a detection signal indicative of the voltage value of the detection signal; a gate control means for controlling gate potential of the main transistor and gate potential of the current detector transistor when the detection signal fed from the current detecting means exceeds a predetermined voltage limit to protect the main transistor from an overcurrent; a main transistor gate circuit connecting the gate control means with the gate of the main transistor; and a detector transistor gate circuit connecting the gate control means with the gate of the current detector transistor; and by setting the time constant of the detector transistor gate circuit at shorter value than the time constant of the main transistor gate circuit.

Since the main transistor is a transistor which is controlled through its insulated gate, such as a MOS transistor, insulated gate bipolar transistor, etc., and is very often comprised of many repeated unit structures, it is preferable to assign one of the unit structures to the current detector transistor. It is simple but sufficient to use a resistor as the current detecting means.

It is preferable to provide the gate control means with a comparator circuit for comparing a voltage value of the detection signal with a predetermined reference voltage value and for outputting an output signal when the voltage value of the detection signal exceeds the reference voltage value, and a control circuit for outputting, in response to the output signal, a control signal for controlling gate potential of the main transistor and gate potential of the current detector transistor. It is preferable to further provide the gate control means with a control transistor having a predetermined operation threshold which is operated when a voltage value of the detection signal exceeds the threshold. It is also preferable to further provide the over-current protection apparatus with a circuit element, incorporated with the control transistor, for setting minimum gate control voltage values for the main transistor and the current detector transistor when the control transistor is in operation. In the above over-current detection apparatuses, it is preferable to set the time constant of the detector transistor gate circuit at less than one tenth of the time constant of the main transistor gate circuit.

Accurate proportionality between the current flowing through the current detector transistor and the current flowing through the main transistor is obtained preferably by the over-current protection apparatus of the present invention which is comprised of a semiconductor base plate into which the main transistor and the current detector transistor are built-in side by side to form a channel portion in a surface portion of the base plate; and insulation film covering surface portions between the main transistor and the current detector transistor, in which the gate of the current detector transistor is extended to cover the insulation film. The insulation film is preferably as thick as field oxidation film. It is also preferable to extend the gate of the main transistor over the insulation film and build in a stopper layer, of opposite conductivity type to the conductivity type of the semiconductor base plate, by in-diffusion from the surface of the semiconductor base plate between the edges of the extended portions of the gates of the main and the current detector transistors.

The resulting apparatus is advantageous in that it improves current detection capability and speed while eliminating oscillation by simple and practicable means.

Assignment of Reference Numerals and Symbols

Figure 1A:
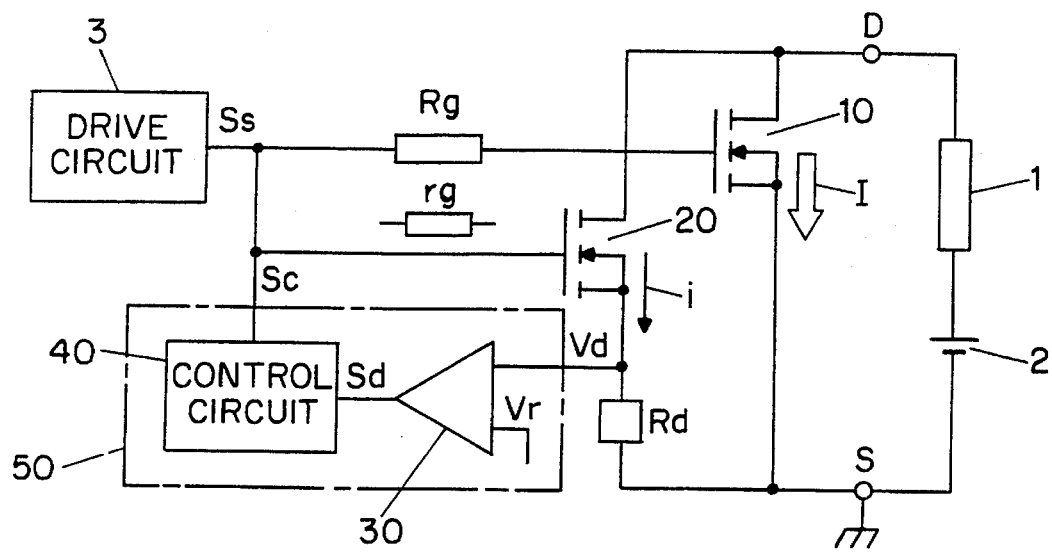
FIG. 1(a) is a block circuit diagram of an embodiment of the present invention in which a main transistor is a power MOS transistor.

| | |
|---|---|
| 1 | load of main transistor |
| 2 | power supply |
| 3 | drive circuit |
| 10 | power MOS transistor as main transistor |
| 11 | insulated gate bipolar transistor as main transistor |
| 20 | current detector transistor |
| 21 | current detector transistor |
| 30 | comparator circuit |
| 40 | control circuit |
| 50 | gate control means |
| 51 | control transistor for gate control means |
| 52 | series resistor for gate control means |
| 53 | Zener diode for gate control means |
| 54 | diode for gate control means |
| 60 | semiconductor base plate |
| 64 | stopper layer |
| 65 | insulation film |
| 67 | gate |
| 67a | extended portion of gate |
| A | response characteristics of the present apparatus |
| B | response characteristics of the prior art |
| Rd | current detecting means |
| Rg | gate resistance of main transistor |
| rg | gate resistance of current detector transistor |
| Sc | control signal from gate control means |
| Sd | comparison signal from comparator circuit |
| Vd | detection signal or voltage value of detection signal from current detecting means |
| Vr | reference voltage for comparator circuit |

DETAILED DESCRIPTION OF THE INVENTION

According to the prior art, it is impossible to improve the response of the gate control by reducing the time constant of the gate circuit. This is so because the time constant is a product of capacitance and resistance, the electrostatic gate capacitance of the main transistor of a power semiconductor device is very large, and the transistor's gate resistance is selected in relation to the load. The present invention, which is based on the finding that oscillation in gate control is prevented simply by improving the response of the gate control on the side of the current detector transistor, has solved the aforementioned problem by separating the gate of the current detector transistor from the gate of the main transistor, by setting the time constant of the detector transistor gate circuit at a shorter value than that of the main transistor gate circuit, and by feeding the control signal output from the feedback system (which includes the current detecting means) into the gate control means to the detector transistor gate circuit.

The prior art has adopted a common gate, which is disposed commonly to the main and current detector transistors and which provides the gate circuits of the main and current detector transistors with the same time constant. According to the prior art, since the feedback system with quick response and high gain controls the gates ineffectively or forcibly based on the result of current detection of slow response, oscillation in the gate control tends to occur. In contrast to this, according to the present invention, the proportionality between the currents of the main and current detector transistors based on the principles of the Miller current circuit is virtually maintained, except during a limited transient period, since, in the present invention, the gate of the current detector transistor is connected to the gate of the main transistor through its gate resistance; the gates of the current detector and the main transistors receive the same control signal from the feedback system; and the resistance of the gate of the current detector transistor is low. According to the present invention, it is not necessary to connect a phase compensation capacitor when an operational amplifier is used for the comparator circuit. If the phase compensation capacitor is used, a capacitor of small capacitance will be acceptable.

Now the present invention will be described in detail hereinafter with reference to the accompanied drawings which illustrate preferred embodiments of the present invention.

Figure 1B:
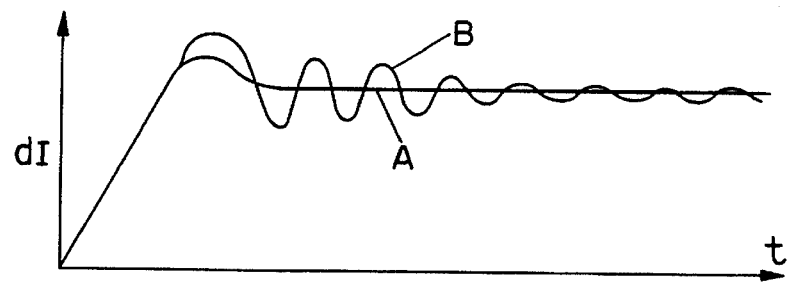
FIG. 1(b) is a graph showing response characteristics of the embodiment of FIG. 1(a) and of the prior art.
Figure 2:
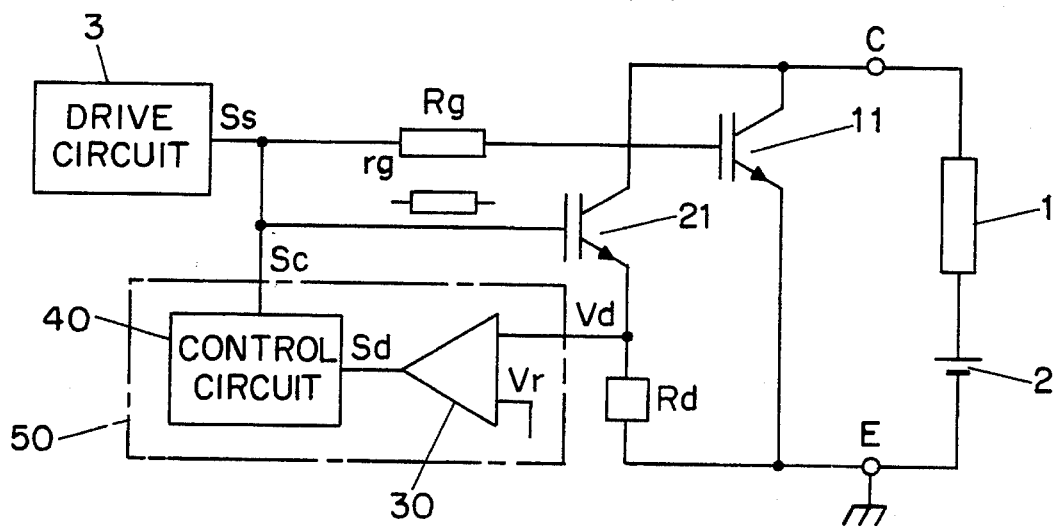
FIG. 2 is a block circuit diagram of an embodiment of the present invention in which a main transistor is comprised of an insulated gate bipolar transistor.
Figure 3:
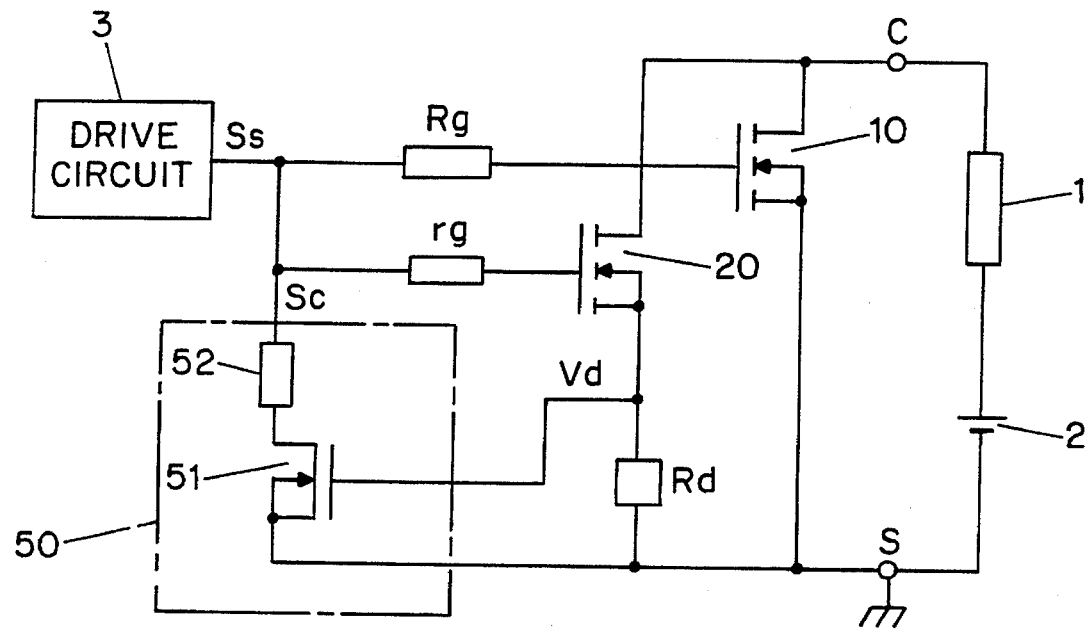
FIG. 3 is a block circuit diagram showing another embodiment in which a main transistor is comprised of a power MOS transistor.
Figure 4:
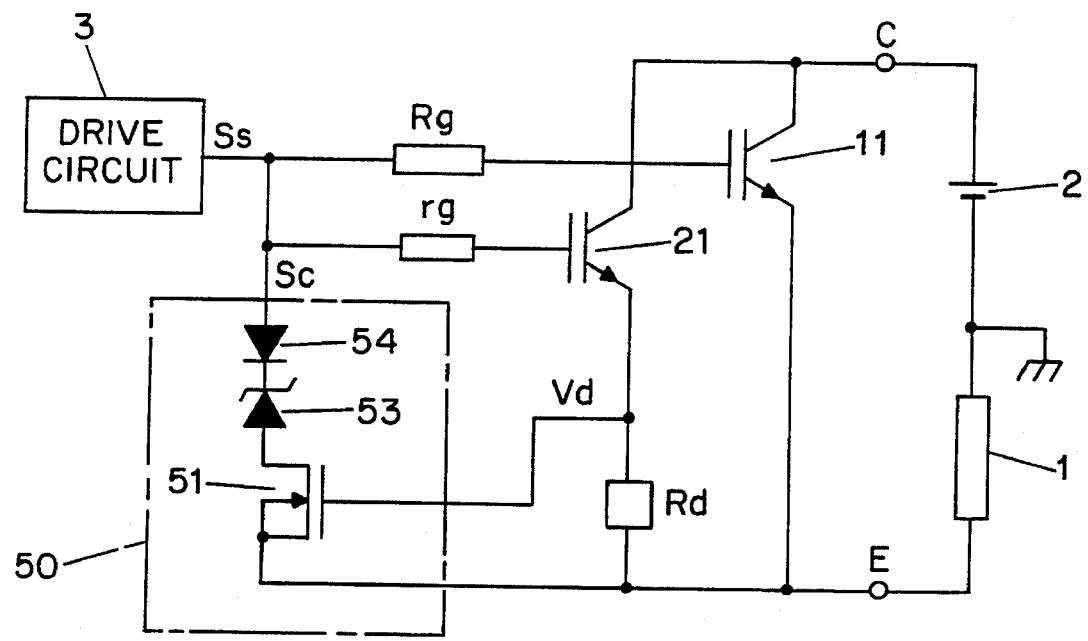
FIG. 4 is a block circuit diagram showing another embodiment in which a main transistor is comprised of an insulated gate bipolar transistor.
Figure 5:
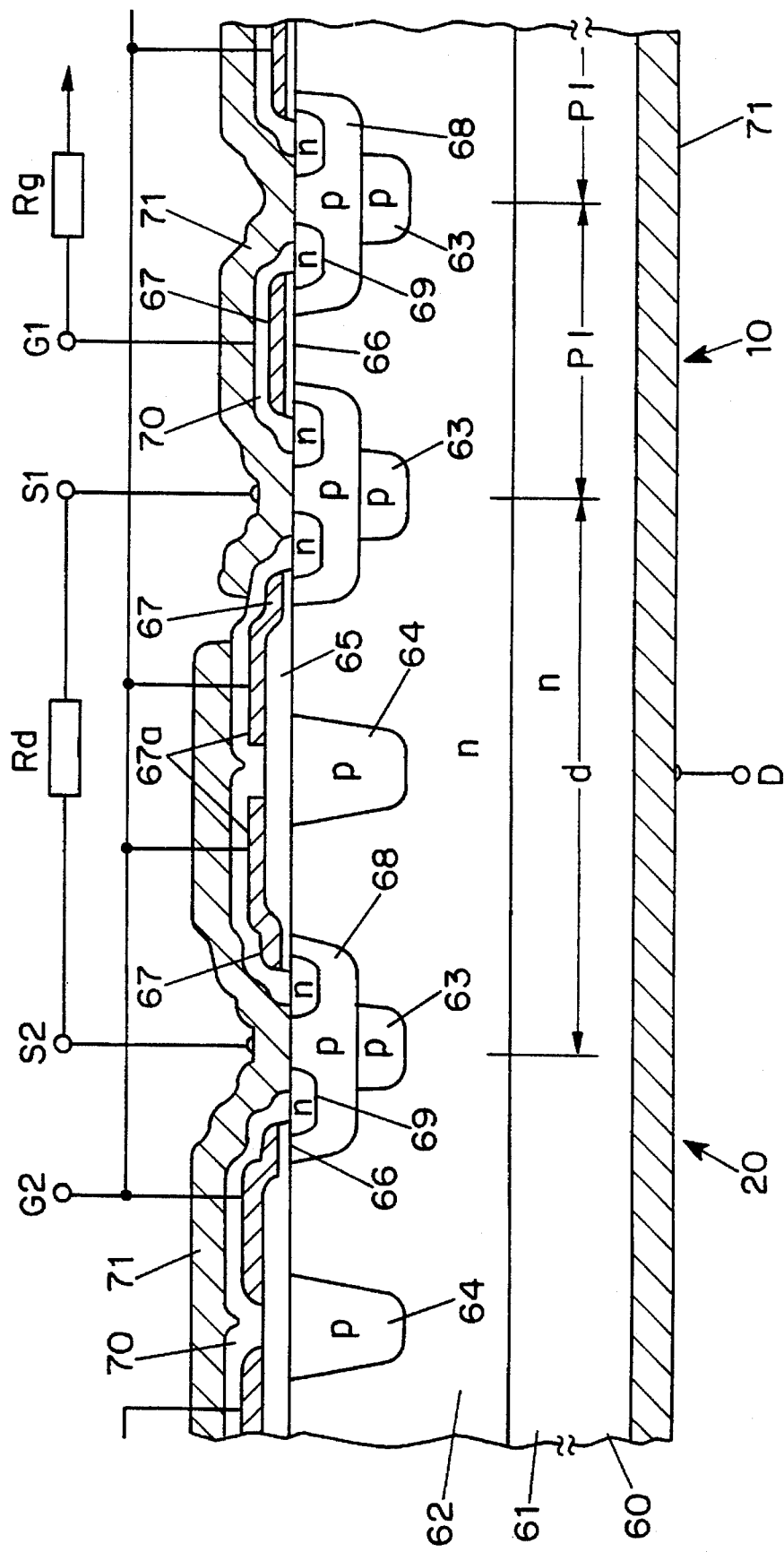
FIG. 5 is a sectional view of a semiconductor apparatus into which a main transistor and a current detector transistor are integrated.

FIG. 1(a) is a block circuit diagram of an embodiment of the present invention in which a main transistor is a MOS transistor, and FIG. 1(b) is a graph showing response characteristics of the embodiment of FIG. 1(a). FIG. 2 is a block circuit diagram of an embodiment of the present invention in which the main transistor is an insulated gate bipolar transistor. FIG. 3 is a block circuit diagram showing another embodiment modified from FIG. 1(a). FIG. 4 is a block circuit diagram showing another embodiment modified from FIG. 2. And FIG. 5 is a sectional view of a semiconductor apparatus into which a main transistor and a current detector transistor are incorporated. Throughout these drawings, the parts corresponding to those in FIG. 6 are designated by the same reference numerals or symbols used in the background section, and their explanations are omitted for simplicity.

Figure 6:
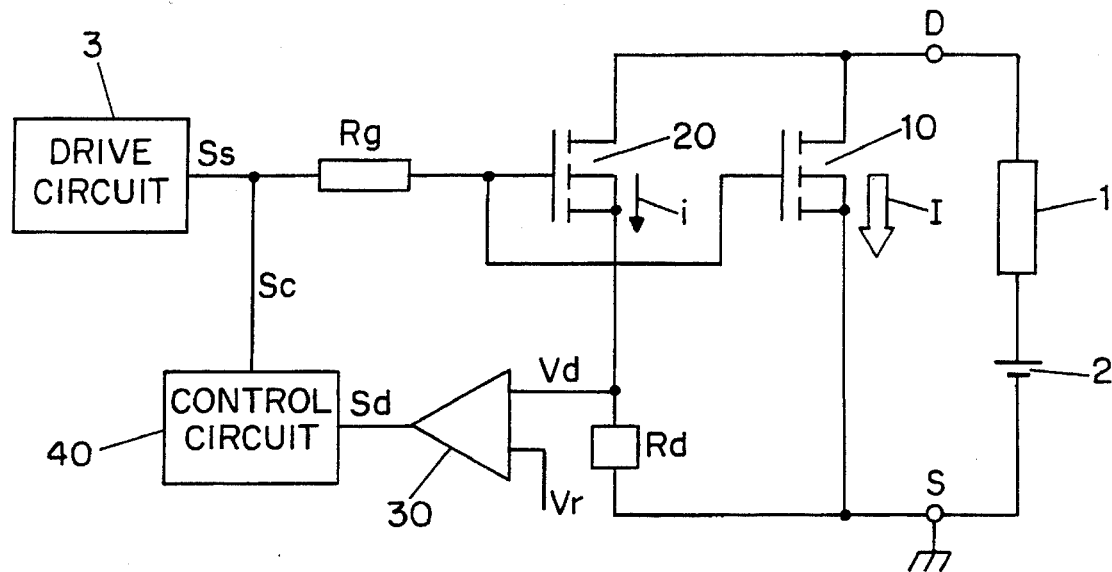
FIG. 6 is a block circuit diagram of an over-current protection apparatus according to the prior art.

As with the prior art apparatus in FIG. 6, the main transistor 10 and the current detector transistor 20 shown in FIG. 1(a) are structurally similar and built in a semiconductor apparatus, and their load side terminals are commonly connected as a drain terminal D. However, a major difference between the embodiment of FIG. 1(a) and the prior art of FIG. 6 is that the gate potential is separated between the main and the current detector transistors 10 and 20 in FIG. 1(a). The electrostatic capacitance of the gate of the current detector transistor 20 is 1 pF or less. This value is much smaller than the 1 nF or more of the main transistor 10 because the current detector transistor 20 is of small capacitance through which a current i on the order of one several thousandth or less of the main transistor 10 flows. The drive command Ss from the drive circuit 3, which designates ON and OFF for example, is fed to the main transistor 10 as usual through gate resistance Rg and directly, in this embodiment, to the current detector transistor 20.

Figure 7:
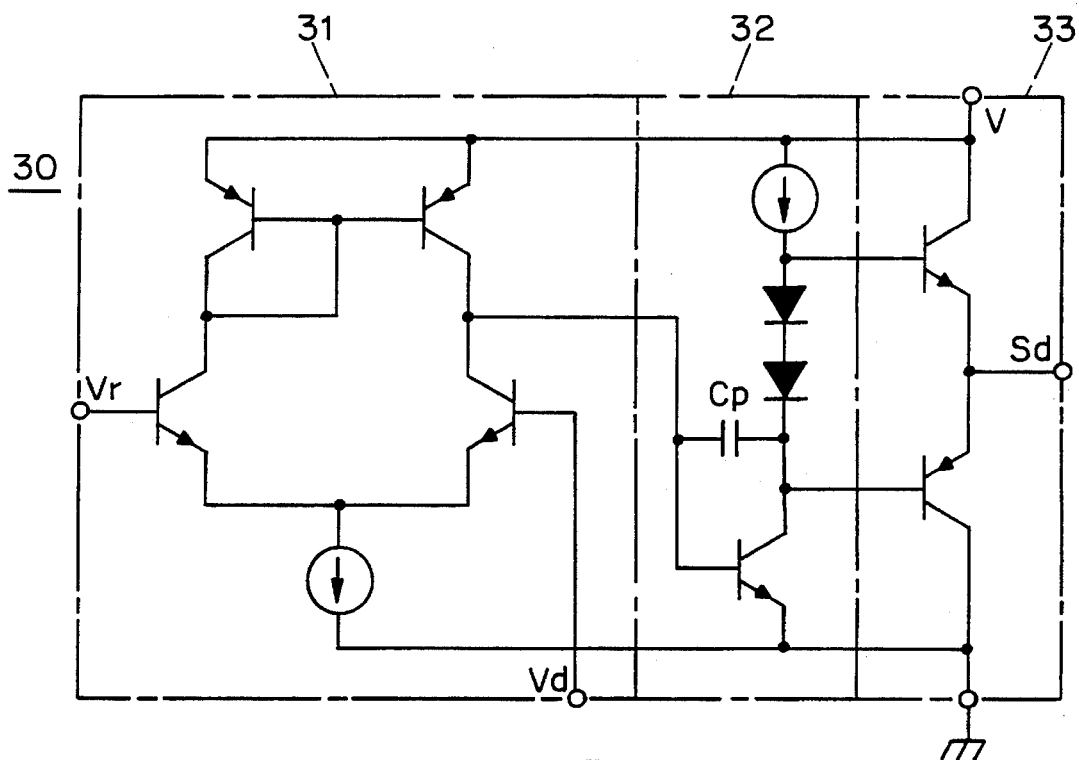
FIG. 7 is a circuit diagram of an operational amplifier used in the over-current protection apparatus according to the prior art.

A current detecting means Rd is comprised of, for example, a resistor which receives the current i flowing through the current detector transistor 20 and outputs the detection signal Vd indicative of the voltage drop across the resistor. A gate control means 50 which receives the detection signal Vd is comprised as illustrated by a single dotted chain line of a comparator circuit 30 and a control circuit 40. The comparator circuit 30 compares the detection signal Vd with the reference voltage Vr and outputs a comparison output Sd. Though a comparator may be used as the comparator circuit 30, it is more preferable to use an operational amplifier as shown in FIG. 7. In this case, a phase compensation capacitor shown in FIG. 7 is not always necessary. Even when a phase compensation capacitor is incorporated, a capacitor with a small capacitance value from several to several ten pF is feasible. The same control circuit 40 as that of FIG. 6 may be used which feeds the control signal Sc into the gates of the main transistor 10 and the current detector transistor 20 by superimposing the control signal Sc onto the drive command Ss produced by the drive circuit 3 as illustrated in FIG. 1(a).

In the protection apparatus described above, since the gates of the main and the current detector transistors 10 and 20 are only separated by a low gate resistance Rg, an exact linear proportionality holds between the currents I and i of the both transistors based on the principles of the Miller current circuit. As is easily estimated from the above described electrostatic capacitance of the gates, the time constant of the gate of the current detector transistor 20 is usually less than one thousandth of the time constant of the main transistor. In practice, this time constant ratio equates to less than tenths to hundredths because of the equivalent resistance of the gate itself and the gate wiring, a small resistance connected for adjusting the response of current detection, and the stray capacitance of the wiring. It is effective to adjust the time constant of the gate circuit of the current detector transistor 20 at less than one tenth of that of the main transistor 10 for taking full advantage of the present invention.

FIG. 1(b) is a graph showing response characteristics of the embodiment of FIG. 1(a). In the figure, the abscissa represents time t and the ordinate represents the change of the current I, ΔI, of the main transistor 10 when the control signal Sc is abruptly changed. In FIG. 1(b), curve A represents the response according to the present invention and curve B represents the response according to the prior art. As the figure reveals, while the current change ΔI oscillates as the characteristic curve B according to the prior art expresses, the characteristic curve A of the present invention does not show any oscillation and converges to a constant value a short time after a small peak has occurred. Since current detection response is quick because of the short time constant of the current detector transistor 20 according to the present invention, it becomes unnecessary to forcibly conduct gate control based on the slow current detection response according to the prior art.

In an embodiment of FIG. 2, the main and current detector transistors 11 and 21 are comprised of insulated gate bipolar transistors. Load side collector terminals C of the transistors 11, 21 are connected in common and an emitter terminal E of the main transistor 11 is grounded. These are the only differences between FIG. 2 and FIG. 1(a) with regard to the connection of transistor 11 with transistor 21. As is well known, the insulated gate bipolar transistor is especially suitable for large current use. Since the main transistor is comprised of, as in the power MOS transistor embodiment, many repeated unit structures, the current detector transistor 21 is easily incorporated with the main transistor 11 by assigning one or two unit structures to the current detector transistor 21.

In an embodiment of FIG. 3, the gate control means 50 is configured more simply than in the other embodiments described above. In FIG. 3, a field effect type control transistor 51 is incorporated into the gate control means 50 and the operation threshold of the gate of the control transistor 51 is utilized as the limit value with which the voltage of the detection signal Vd from the current detecting means Rd is compared. For this purpose, the detection signal Vd is fed to the gate of the control transistor 51 to switch on the control transistor 51 when the voltage value of the detection signal Vd exceeds the threshold value of the gate as shown in the figure. In the illustrated embodiment, the gate potential of the main transistor 10 and the gate potential of the current detector transistor 20 are lowered through a resistor 52 when the control transistor 51 is switched on to protect the main transistor from an over-current. Since variation of the gate threshold value of the control transistor 51 can be maintained within ±10%, the gate threshold value can satisfactorily be used as the limit value with which the voltage value of the detection signal Vd is compared for over-current protection. The resistance value of the current detecting means Rd is preferably set within a range between several $\Omega$ and 1 k$\Omega$ when the gate threshold value of the control transistor 51 is 1 V as usual.

The resistor 52 is incorporated into the gate control means 50 in FIG. 3 for limiting a leakage current which flows via the control transistor 51 when the polarity of the drive command Ss from the drive circuit 3 turns to negative and for adjusting the gain of the control transistor 51 to a lower value. In this embodiment, the time constant of the gate circuit of the current detector transistor 20 is adjusted by connecting a gate resistance rg of small value so as to maintain a fairly constant proportionality of the ratio of current of the current detector transistor 20 to the current of the main transistor 10 even when the load 1 abruptly changes. Though the main transistor 10 and the current detector transistor 20 are shown as the MOS transistors in FIG. 3, the transistors 10, 20 may be of the type of insulated gate bipolar transistors.

In an embodiment shown in FIG. 4, the main transistor 11 and the current detector transistor 21 are illustrated by bipolar transistors. In contrast to the embodiments described above in which the main transistor 11 is used for example as a high side switch, the main transistor 11 is used in the embodiment of FIG. 4 as a low side switch connected directly to a power supply 2. Also, the gate resistance rg is connected to the current detector transistor 21 as in the FIG. 3 embodiment.

In FIG. 4, the control transistor 51 is incorporated into the gate control means 50 as in FIG. 3. In FIG. 4, a Zener diode 53 and a diode 54 are used in place of the resistor 52. The Zener diode 53 is used for preventing oscillation, which often occurs in association with an abrupt change in the gate potential, by setting minimum potential for the gates of the main and the current detector transistors 11, 21. Thus the Zener diode 53 provides a function which corresponds to the above described gain adjustment by the resistor 52. The diode 54 prevents the aforementioned leakage current or a reverse current from flowing to the drive circuit 3 when the drive command Ss turns to negative.

In the embodiments described in FIGS. 3 and 4, the electrostatic capacitance of the main power transistor 10 or 11 is usually about 5 nF, the electrostatic capacitance of the small current detector transistor 20 or 21 is less than 1 pF, and the capacitance ratio is from 1000 to 10,000:1. It has been found by an experiment, in which the gate resistance Rg for the main transistor 10 or 11 is set at 100 $\Omega$ and the gate resistance rg for the current detector transistor 20 or 21 is varied, that the oscillation prevention function as shown by the curve A in FIG. 1(b) is obtained with excellent reproducibility where the gate resistance rg is varied from 1 $\Omega$ to 10 k$\Omega$.

In place of the MOS transistor for the control transistor 51 of the gate control means 50 of FIGS. 3 and 4, a transistor or a switching element which has an operation threshold on the input side such as a junction type field effect transistor, a bipolar transistor, etc., may be used. Though a MOS transistor or an insulated gate bipolar transistor is used for the main transistor 10 or 11 in FIGS. 1 to 4, the present invention is also applicable to any power semiconductor apparatus comprised of a semiconductor device having an insulated gate such as a MOS gate type thyristor.

A structure which is suitable for incorporating MOS transistors as the main and current detector transistors 10 and 20 into a semiconductor apparatus will be explained with reference to FIG. 5. FIG. 5 shows two unit structures for the main transistor 10 on the right hand side of the figure and a unit structure for the current detector transistor 20 on the left hand side. A semiconductor base plate 60 is comprised of an n-type semiconductor substrate 61 and an epitaxial layer 62 grown on the semiconductor substrate 61. The transistors 10 and 20 with vertical structure are built into the epitaxial layer 62 from the surface side.

At first, a deep well 63 for each unit structure and a stopper layer 64 between the transistors 10 and 20 with impurity concentration of from $10^{17}$ to $10^{18}$ atoms/cm$^3$ are simultaneously diffused 4–8 μm deep from the surface of the epitaxial layer 62. Then so-called field oxide film of about 1 μm in thickness is deposited as insulation film 65 on the entire surface of the epitaxial layer 62. The field oxide film is etched off leaving a portion between both transistors behind. Very thin gate oxide film 66 is then deposited on the surface of the etched-off portion.

Then, photo-etching and patterning is applied on polycrystalline silicon grown for a gate 67. The gate 67 is directly formed on the gate oxide film 66 on the side of the main transistor 10. On the side of the current detector transistor 20, an extended portion 67a of the gate 67 is extended from above the gate oxide film 66 over to the insulation film 65. In the embodiment of FIG. 5, the extended portion 67a of the gate 67 is also extended from the edge of the unit structure for the main transistor 10 over to the insulation film 65. After the gate 67 is formed, a p-type well layer 68 and a pair of n-type source layers 69 are built in for each unit structure in so-called double diffusion structure by ion implantation of p-type and n-type impurities using the gate 67 as a mask and by simultaneous thermal diffusion of the implanted impurities. For example, the p-type well layer 68 with impurity concentration of $10^{17}$ atoms/cm$^3$ is diffused to the substantial depth of from 2 to 4 μm and the n-type source layer 69 with impurity concentration of $10^{19}$ atoms/cm$^3$ is diffused to shallow depth.

Then, the surface is covered with inter layer insulation film 70, predetermined portions of which are then opened for windows. An aluminum electrode 71 is then deposited to form a source terminal S1 of the main transistor 10 and a source terminal S2 of the current detector transistor 20. Electrode film 71 is deposited also on the back surface of the base plate 60 to form a common drain terminal D of the transistors 10, 20. Gate terminals G1 and G2 of the transistors 10 and 20 are individually led out from the portions not shown in FIG. 5. The current detector resistance Rd and the gate resistance Rg are built in the semiconductor base plate 60 in the form of, for example, so-called diffused resistors.

In the main transistor 10 and the current detector transistor 20 thus built in, a channel is formed in the surface portion of the well 68 beneath the gate 67. Electrons as the majority carrier flow from the source layer 69 connected to the source terminals S1, S2 into the epitaxial layer 62 through the channel and then flow vertically to the drain terminal D through the semiconductor substrate 61. FIG. 5 will illustrate a structure of an insulated gate bipolar transistor when the semiconductor substrate 61 is replaced by a p-type one.

When the transistors 10 and 20 are arranged side by side as shown in the figure, electric charges are induced on the surface of the epitaxial layer 62 between the transistors 10 and 20, and a leakage current flows from the current detector transistor 20 to the main transistor 10, which tends to cause an error in current detection. However, the embodiment of FIG. 5 prevents the leakage current by reducing electric field gradient on the epitaxial layer 62 with the relatively thick insulation film 65 covering the surface of the epitaxial layer 62 and the extended portion 67a of the gate 67 disposed on the insulation film 65.

Furthermore, the embodiment of FIG. 5 almost completely shuts off the leakage current with the p-type stopper layer 64 in diffused in the surface portion of the n-type epitaxial layer 62 around the gap between the edges of the extended portions 67a's of the gates of the transistors 10 and 20. The stopper layer 64 is preferably biased to the electric potential of the source terminal S1 or S2, among which the electric potential of the source terminal S2 is especially recommended, though the electric potential of the stopper layer 64 may be floated. The provision of the stopper layer 64 does not increase processing steps, since the stopper layer 64 is in-diffused simultaneously when the deep well 63 is formed in each unit structure for preventing latch-up.

In FIGS. 1 through 4, the over-current protection apparatus is shown for one main transistor 10 or 11. The over-current protection apparatus of the present invention may be installed on each of the main transistors or on a representative transistor and a drive circuit 3 in common to the main transistors, since from 4 to 6 main transistors are used in a three-phase or two-phase bridge circuit for a power inverter or for motor drive. Since the integrated circuits into which the over-current protection apparatus is incorporated with several main transistors 10 or 11 have been increasing in these days, the structure of FIG. 5 can be effectively applied to these integrated circuits. The over-current protection apparatus of the present invention is best suited for over-current protection of large capacity main transistors with withstand voltage of from 600 to 2000 V and with the rated current of from 10 to several hundreds A.

The present invention has solved the problem of the prior art based on the finding that oscillation at gate control in over-current protection is prevented simply by improving the response of gate control on the side of the current detector transistor. According to the present invention, which protects the main transistor from over-current by reducing electrostatic gate capacitance of the current detector transistor by separating the gate of the current detector transistor from the gate of the main transistor, by setting the time constant of the detector transistor gate circuit at a much shorter value than, preferably at less than one tenth of, that of the main transistor gate circuit, by feeding the detection signal obtained by detecting the current flowing through the detector transistor with a current detecting means to the gate control means, and by controlling the gates of the main and current detector transistor when the detection signal exceeds a predetermined limit value, the following effects are obtained:

(a) Since the present invention eliminates the unbalance in the prior art between quick response of the feedback system and slow response of the current detection system by shortening the time constant of the gate circuit of the current detector transistor and by improving the response speed of the current detection system, the present invention facilitates the removal of circuit oscillation relating to the over-current protection without forcibly conducting gate control on the main and the current detector transistor.

(b) The present invention facilitates the full utilization of the quick response of the feedback system to realize quicker over-current protection and the incorporation of the over-current protection apparatus into an integrated circuit, since the present invention makes it unnecessary to provide a substantial phase compensation function to the gate control means, in which an operational amplifier is used in the comparator circuit, by improving the gate control response of the current detector transistor to prevent the circuit oscillation.

(c) The embodiment, which provides the gate control means with the control transistor to the gate of which the detection signal from the current detecting means is fed and drives the control transistor to control the gates of the main and the current detector transistor when the voltage of the detection signal exceeds the threshold of the gate control transistor, simplifies the circuit configuration of the over-current protection apparatus with more practical utility. The embodiment, comprised of a circuit element which sets the minimum value of the gate control voltage for controlling the main and the current detector transistors when the control transistor is in operation, further improves the preventive function against circuit oscillation.

(d) The embodiment, in which the insulation film covers the surface portions between the main transistor and the current detector transistor and at least one of the gates of the main transistor and the current detector transistor extends over to the insulation film, and the embodiment, in which the stopper layer of opposite conductivity type to the conduction type of the semiconductor base plate is formed by in-diffusion from the surface of the semiconductor base plate between the channel portions of the main transistor and the current detector transistor, facilitate preventing the leakage current from flowing from the current detector transistor caused by induced electric charges on the semiconductor surface and improve over-current detection precision by the improvement of the proportionality between the over and detected currents.

We claim:

1. An apparatus for protecting a main transistor from an over-current flowing therethrough, said main transistor having at least a first gate terminal means, said apparatus comprising:

a current detector transistor having at least a second gate terminal means, said current detector transistor connected in a parallel fashion to said main transistor, said first gate terminal means connected to said second gate terminal means through selected electrical means;

current detecting means for sensing an amount of a current flowing through said current detector transistor and for generating a detection signal indicative of said amount;

gate control means responsive to said detection signal for controlling gate potential of said main transistor and that of said current detector transistor when said amount exceeds a predetermined limit;

a main transistor gate circuit connecting said gate control means to said first gate terminal means, said main transistor gate circuit having a first time constant associated therewith; and a detector transistor gate circuit connecting said gate control means to said second gate terminal means, said detector transistor gate circuit having a second time constant associated therewith, said electrical means being selected to shorten said second time constant relative to said first time constant.

2. The apparatus according to claim 1, wherein said second time constant is set at less than one tenth of said first time constant.

3. The apparatus according to claim 1, wherein said gate control means further comprises a comparator circuit for comparing a voltage value of said detection signal with a predetermined reference voltage value, and for outputting an output signal when said voltage value of said detection signal exceeds said reference voltage value, and a control circuit responsive to said output signal for controlling gate potential of said main transistor and gate potential of said current detector transistor, whereby said main transistor is protected from an over-current.

4. The apparatus for a transistor according to claim 1, wherein said gate control means further comprises a control transistor operative when a voltage value of said detection signal exceeds a predetermined threshold, whereby the gate potential of said main transistor and that of said current detector transistor are controlled.

5. The apparatus according to claim 4, further comprising means for setting minimum gate control voltage values for said main transistor and said current detector transistor when said control transistor is operative.

6. The apparatus according to claim 1, further comprising:

a plurality of semiconductor layers, wherein said main transistor and said current detector transistor are disposed side by side; and an insulation film covering portions of a top surface of said layers, at least one of the first and second terminal means extending over part of said insulation film.

7. The apparatus according to claim 1, further comprising a plurality of semiconductor layers, wherein said main transistor and said current detector transistor are disposed side by side, said layers including a base plate of a first conductivity type, and a stopper layer of a second conductivity type different from said first conductivity type, said stopper layer formed by in-diffusion from a surface of said base plate.

8. A semiconductor device having a main transistor and a current detector transistor disposed on a common semiconductor substrate having a first principal surface side, the semiconductor device comprising:

a common drain region of a first conductivity type formed in the first principal surface side of the substrate;

a main-transistor base region and a current-detector-transistor base region formed in a drain surface region of the drain region, the base regions being of second conductivity type;

a main-transistor source region and a current-detector-transistor source region formed in a base surface region of the main-transistor base region and the current-detector-transistor base region, respectively, the source regions being of the first conductivity type;

a main-transistor gate electrode disposed on an insulation film over the base surface region of the main-transistor base region between the main-transistor source and drain regions, and a current-detector-transistor gate electrode disposed on an insulation film over the base surface region of the current-detector-transistor base region between the current-detector-transistor source and drain regions;

a main-transistor source electrode connected to the main-transistor base and source regions, and a current-detector-transistor source electrode connected to the current-detector-transistor base and source regions;

wherein the gate electrodes are separated by a gap, and the current-detector-transistor source electrode is disposed on an insulation film, over both gate electrodes and above the gap.

9. A semiconductor device having a main transistor and a current detector transistor disposed on a common semiconductor substrate having a first principal surface side, the semiconductor device comprising:

a common drain region of a first conductivity type formed in the first principal surface side of the substrate;

a main-transistor base region and a current-detector-transistor base region formed in a drain surface region of the drain region, the base regions being of second conductivity type;

a main-transistor source region and a current-detector-transistor source region formed in a base surface region of the main-transistor base region and the current-detector-transistor base region, respectively, the source regions being of the first conductivity type;

a main-transistor gate electrode disposed on an insulation film over the base surface region of the main-transistor base region between the main-transistor source and drain regions, and a current-detector-transistor gate electrode disposed on an insulation film over the base surface region of the current-detector-transistor base region between the current-detector-transistor source and drain regions;

a main-transistor source electrode connected to the main-transistor base and source regions, and a current-detector-transistor source electrode connected to the current-detector-transistor base and source regions;

wherein the gate electrodes are separated from each other over a portion of the drain surface region under which a diffusion region of the second conductivity type is formed.

* * * * *

UNITED STATES PATENT AND TRADEMARK OFFICE
CERTIFICATE OF CORRECTION

PATENT NO. : 5,621,601
DATED : April 15, 1997
INVENTOR(S) : Fujihira et al.

It is certified that error appears in the above-indentified patent and that said Letters Patent is hereby corrected as shown below:

Title page, item [30], 2nd line, "Jan. 10, 1993" should read —Oct. 1, 1993—.

Col. 2, line 12, "principle" should read —principles—;

Col. 6, line 59, "value a" should read —value—;

Col. 9, line 35, "in diffused" should read —in-diffused—;

Signed and Sealed this

Twenty-sixth Day of August, 1997

Attest:

BRUCE LEHMAN

*Attesting Officer*  *Commissioner of Patents and Trademarks*